(12) United States Patent
Gonzalez

(10) Patent No.: US 7,005,692 B2
(45) Date of Patent: Feb. 28, 2006

(54) MEMORY CELL ARRAYS

(75) Inventor: Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 271 days.

(21) Appl. No.: 10/632,272

(22) Filed: Jul. 31, 2003

(65) Prior Publication Data

US 2004/0023455 A1 Feb. 5, 2004

Related U.S. Application Data

(60) Continuation of application No. 10/368,978, filed on Feb. 18, 2003, which is a division of application No. 10/017,542, filed on Dec. 13, 2001, now Pat. No. 6,593,610.

(51) Int. Cl.
*H01L 29/76* (2006.01)
*H01L 29/94* (2006.01)
*H01L 31/062* (2006.01)
*H01L 31/113* (2006.01)

(52) U.S. Cl. .................. 257/295; 257/302; 257/907
(58) Field of Classification Search ................ 257/295, 257/296, 302, 907
See application file for complete search history.

(56) References Cited

U.S. PATENT DOCUMENTS

| 5,055,898 | A |   | 10/1991 | Beilstein, Jr. et al. |         |
|-----------|---|---|---------|----------------------|---------|
| 5,316,962 | A |   | 5/1994  | Matsuo et al.        |         |
| 5,917,211 | A | * | 6/1999  | Murata et al.        | 257/296 |
| 6,137,713 | A | * | 10/2000 | Kuroda et al.        | 365/149 |
| 6,144,055 | A |   | 11/2000 | Takenaka             |         |

* cited by examiner

*Primary Examiner*—Phuc T. Dang
(74) *Attorney, Agent, or Firm*—Wells St. John P.S.

(57) ABSTRACT

The invention includes a method of forming an array of memory cells. A series of capacitor constructions is formed, with the individual capacitor constructions having storage nodes. The capacitor constructions are defined to include a first set of capacitor constructions and a second set of capacitor constructions. A series of electrically conductive transistor gates are formed over the capacitor constructions and in electrical connection with the capacitor constructions. The transistor gates are defined to include a first set that is in electrical connection with the storage nodes of the first set of capacitor constructions, and a second set that is in electrical connection with the storage nodes of the second set of capacitor constructions. A first conductive line is formed over the transistor gates and in electrical connection with the first set of transistor gates, and a second conductive line is formed over the first conductive line and in electrical connection with the second set of transistor gates. The invention also includes an array of memory cells.

8 Claims, 17 Drawing Sheets

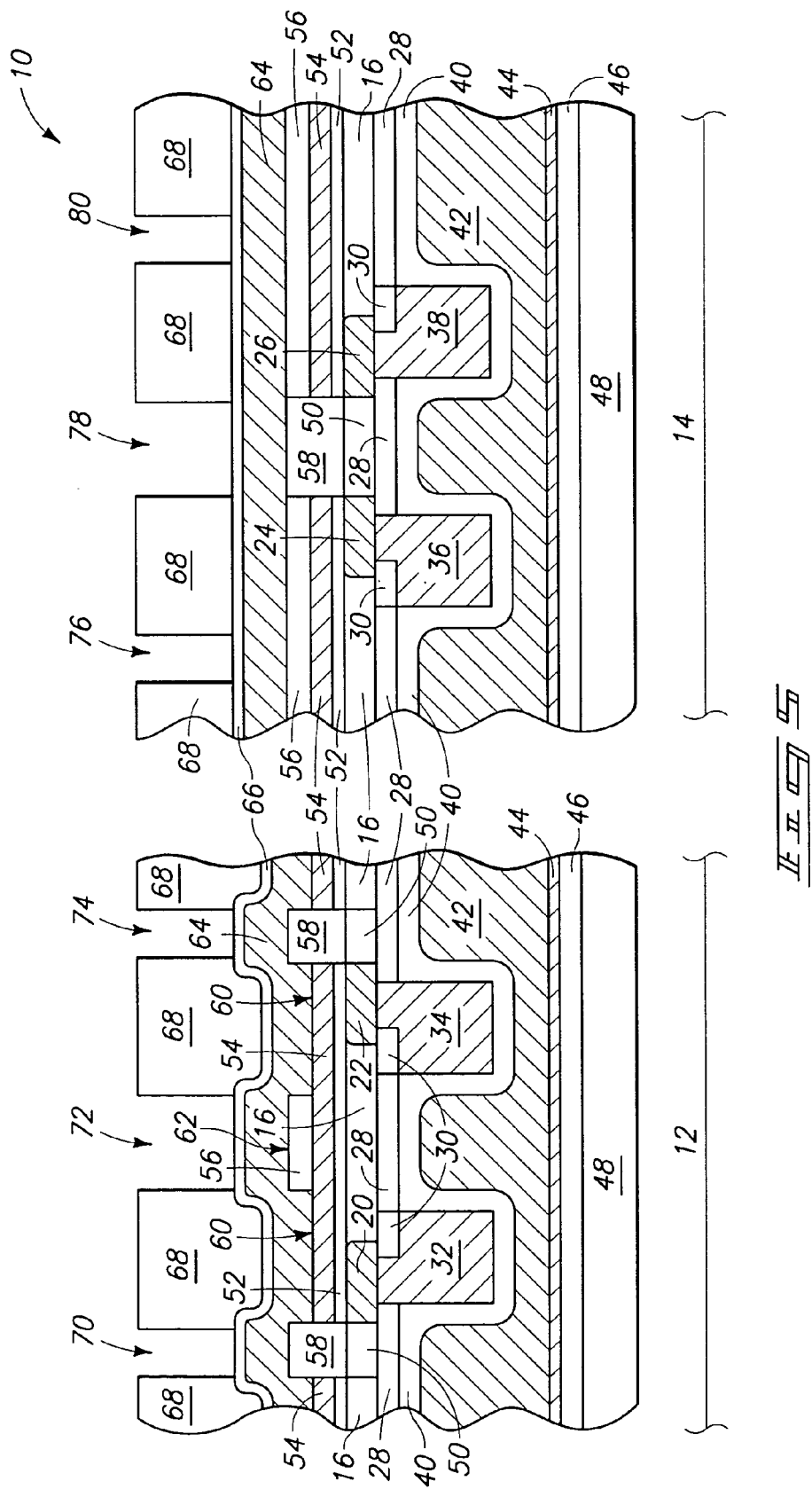

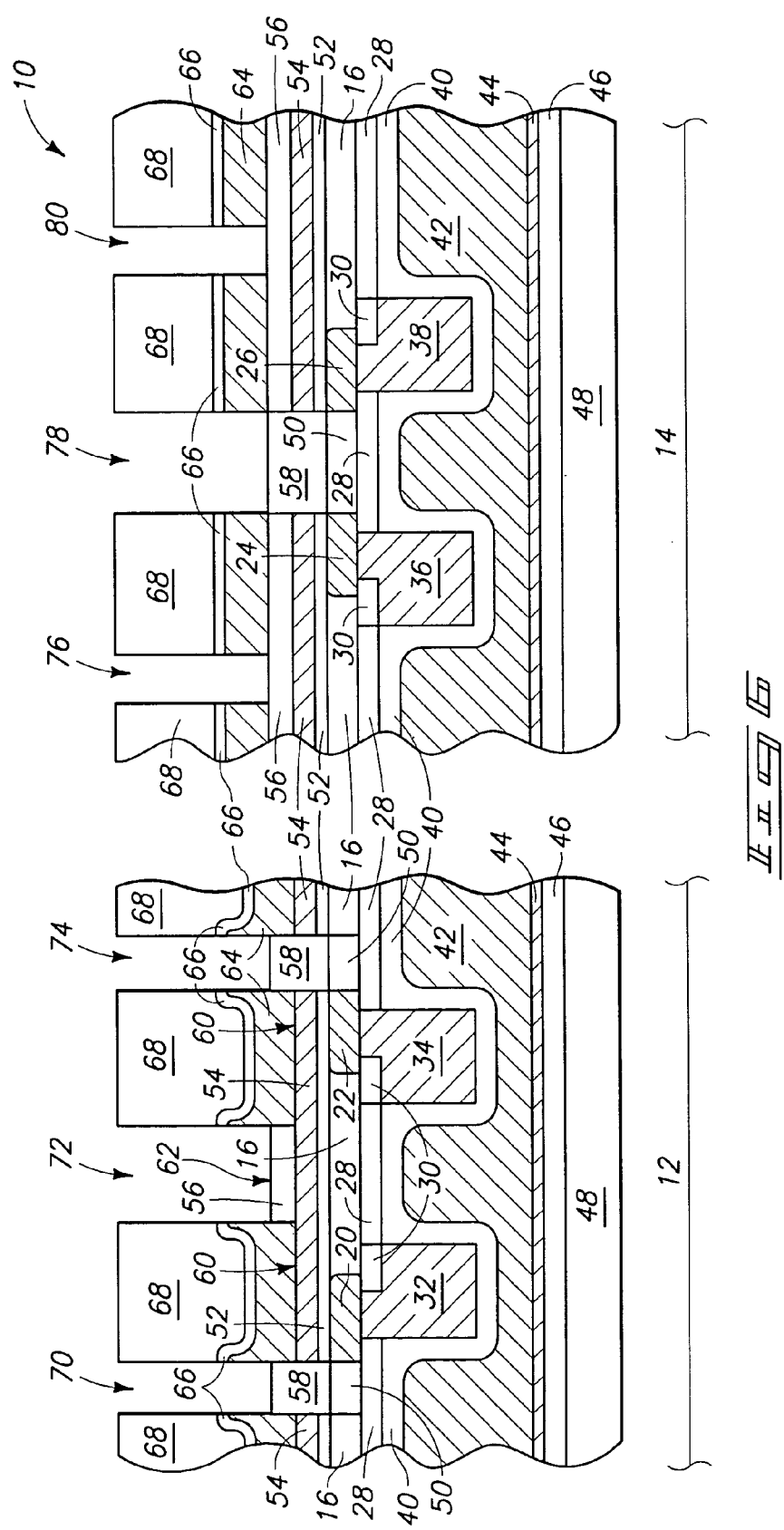

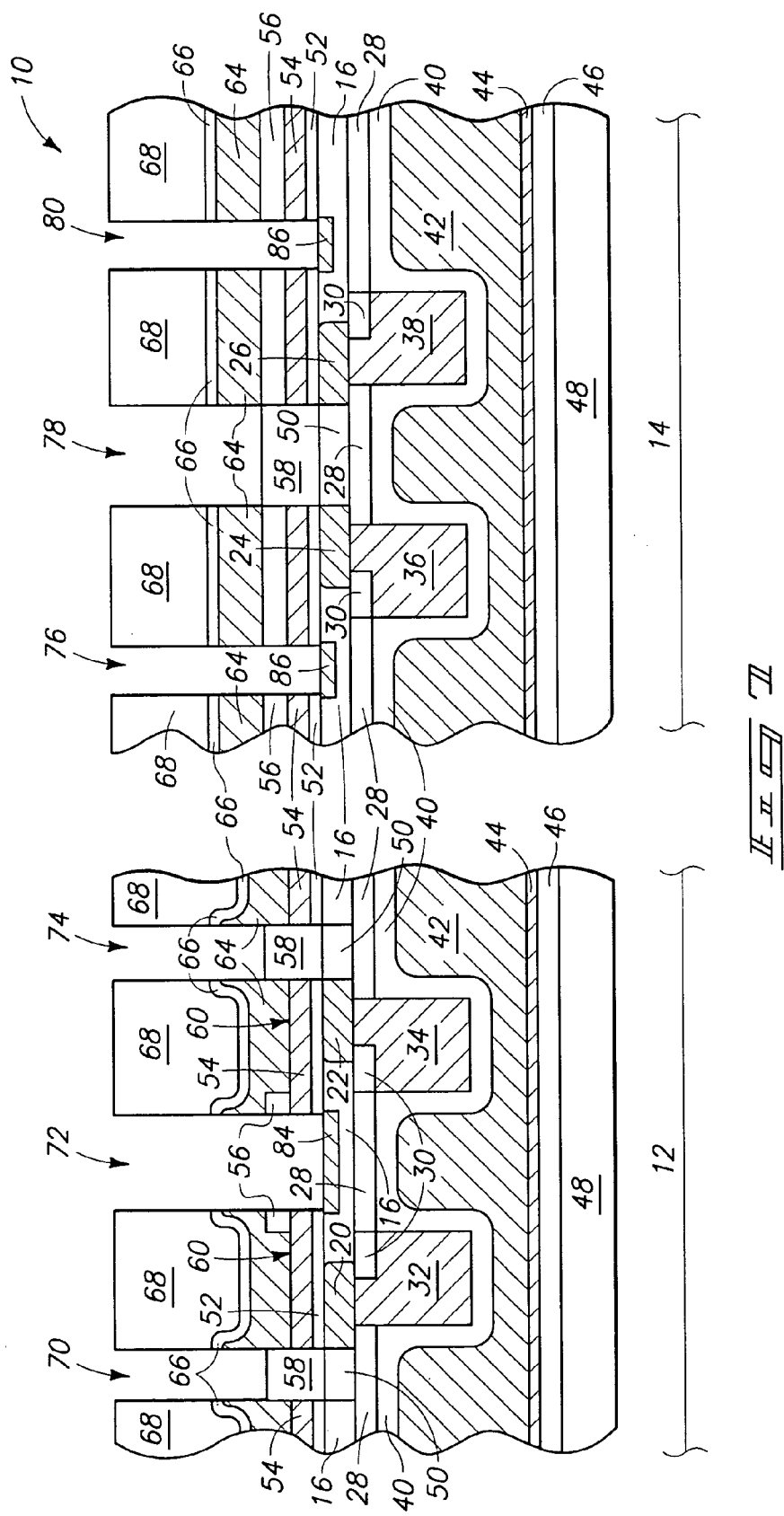

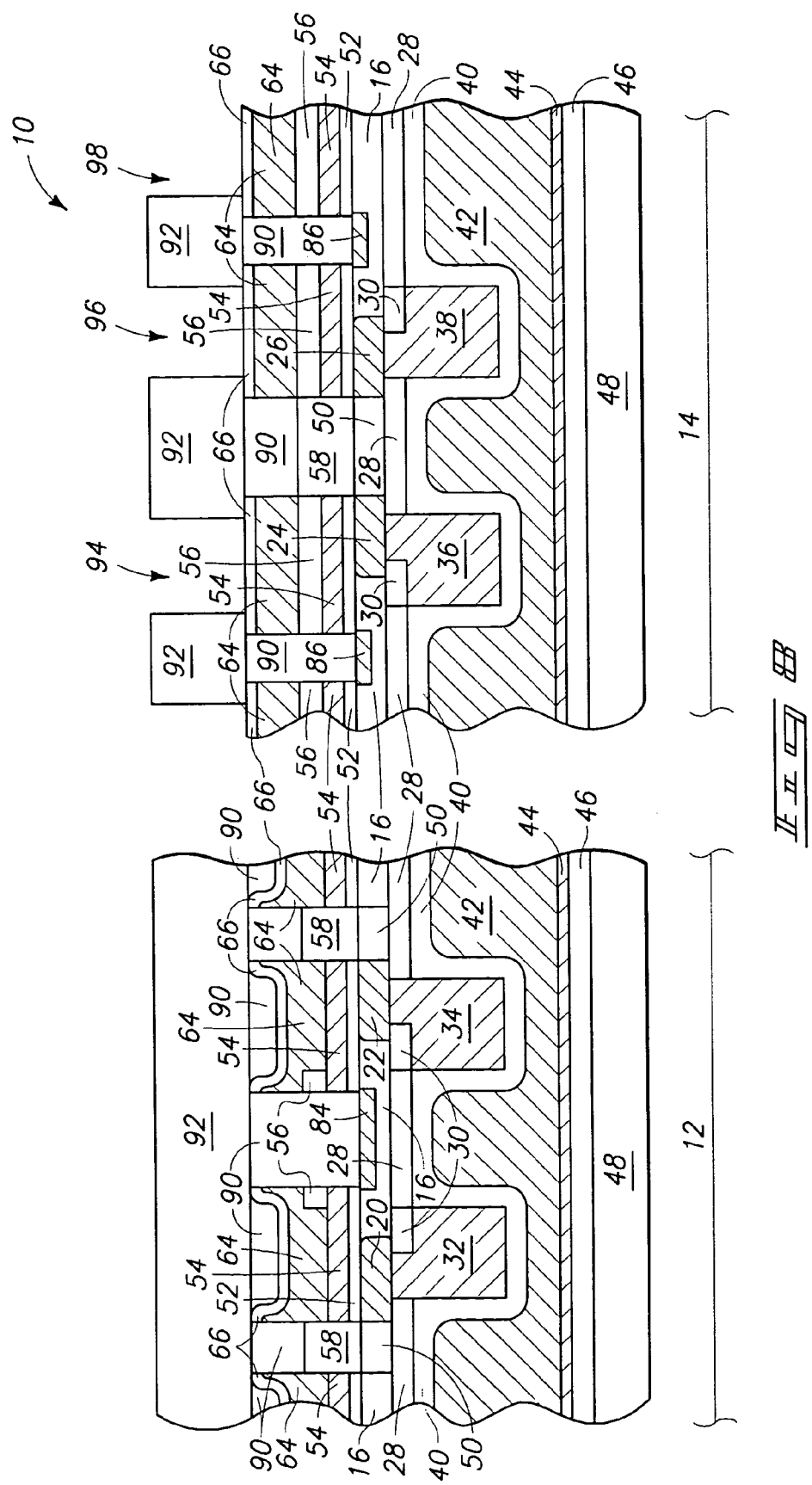

US 7,005,692 B2

MEMORY CELL ARRAYS

CROSS REFERENCE TO RELATED APPLICATION

This patent is a continuation of U.S. patent application Ser. No. 10/368,978, filed on Feb. 18, 2003 which is a divisional of U.S. patent application Ser. No. 10/017,542 filed on Dec. 13, 2001 now U.S. Pat. No. 6,593,610.

TECHNICAL FIELD

The invention pertains to memory arrays and methods of forming memory cells. In particular applications, the invention pertains to methods of forming dynamic random access memory (DRAM) arrays.

BACKGROUND OF THE INVENTION

A continuing goal in semiconductor processing is to reduce the amount of semiconductor wafer real estate consumed by integrated circuit devices. Exemplary integrated circuit devices are memory devices, such as, for example, DRAM devices. The DRAM devices are typically provided in arrays, with individual memory units comprising a transistor and a capacitor. Each individual DRAM unit of the array is provided with a unique address, which enables the individual units to be separately accessible relative to one another for reading and writing memory bits. It would be desirable to develop novel constructions of DRAM devices which reduce an amount of semiconductor real estate associated with the devices.

SUMMARY OF THE INVENTION

In one aspect, the invention encompasses a method of forming an array of memory cells. A series of capacitor constructions is formed, with the individual capacitor constructions having storage nodes. The capacitor constructions are defined to include a first set of capacitor constructions and a second set of capacitor constructions. A series of electrically conductive transistor gates are formed over the capacitor constructions and in electrical connection with the capacitor constructions. The transistor gates are defined to include a first set that is in electrical connection with the storage nodes of the first set of capacitor constructions, and a second set that is in electrical connection with the storage nodes of the second set of capacitor constructions. A first conductive line is formed over the transistor gates and in electrical connection with the first set of transistor gates, and a second conductive line is formed over the first conductive line and in electrical connection with the second set of transistor gates.

In another aspect, the invention encompasses an array of memory cells. The array includes a series of capacitor constructions, with the capacitor constructions being defined to include a first set and a second set. A conductive material is over the capacitor constructions, and in electrical connection with storage nodes of the capacitor constructions. A first conductive line is formed over the conductive material and in electrical connection with the first set of capacitor constructions through the conductive material. A second conductive line is over the first conductive line and in electrical connection with the second set of capacitor constructions through the conductive material. The second conductive line is electrically connected with the conductive material through conductive interconnects extending within openings in the first conductive line.

BRIEF DESCRIPTION OF THE DRAWINGS

Preferred embodiments of the invention are described below with reference to the following accompanying drawings.

FIG. 4 is a view of the FIG. 1 portions shown at a processing step subsequent to that of FIG. 3.

FIG. 5 is a view of the FIG. 1 portions shown at a processing step subsequent to that of FIG. 4.

FIG. 6 is a view of the FIG. 1 portions shown at a processing step subsequent to that of FIG. 5.

FIG. 8 is a view of the FIG. 1 portions shown at a processing step subsequent to that of FIG. 7.

DETAILED DESCRIPTION OF THE PREFERRED EMBODIMENTS

Figure 1:
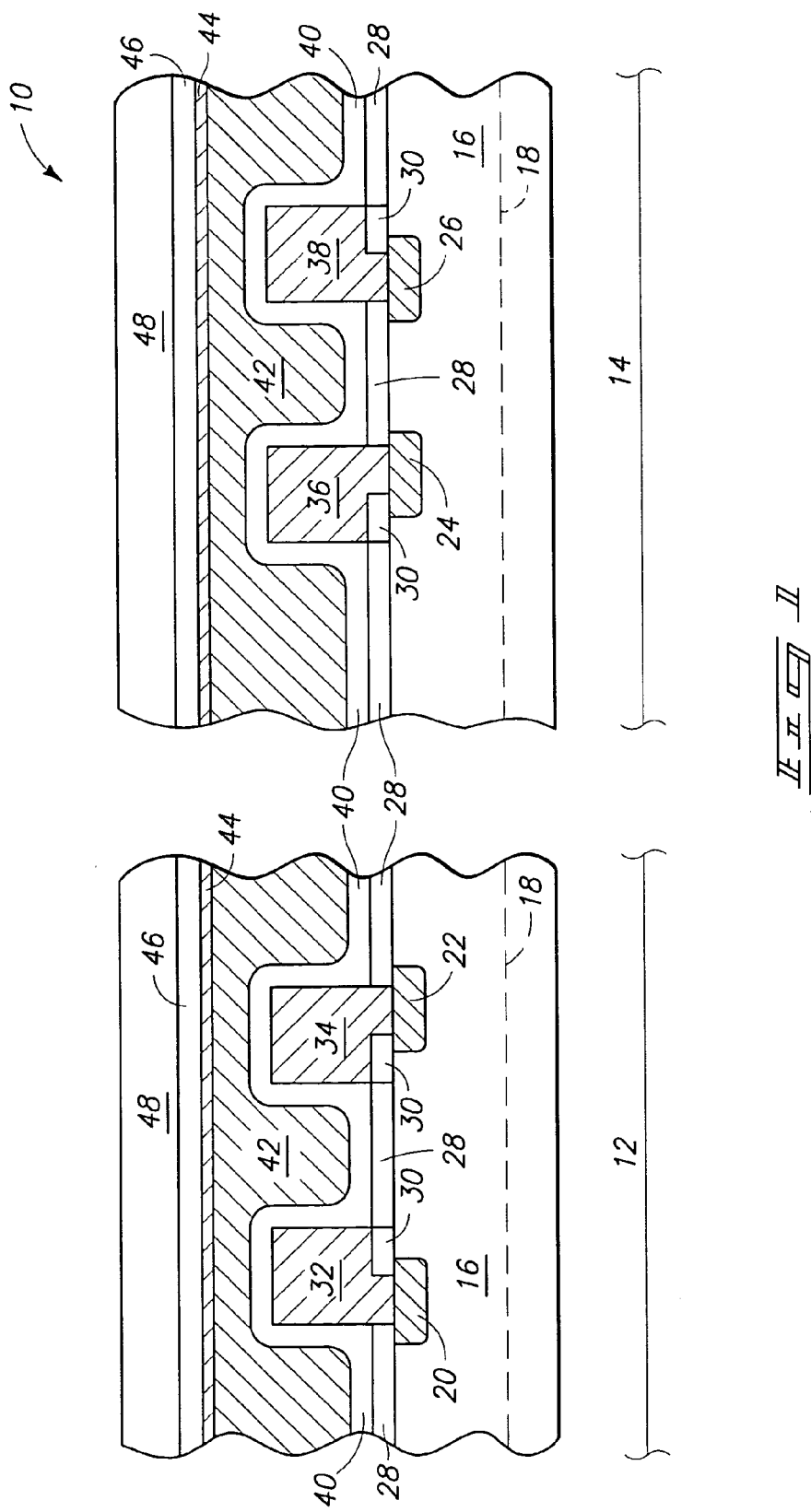
FIG. 1 is a diagrammatic, cross-sectional, fragmentary view of a pair of portions of a semiconductive wafer shown at a preliminary processing step in accordance with a method of the present invention.

An exemplary method of the present invention is described with reference to FIGS. 1–17. Referring initially to FIG. 1, a semiconductor wafer 10 is illustrated in fragmentary view, and specifically, a pair of fragmentary portions 12 and 14 of the wafer fragment 10 are illustrated. Portions 12 and 14 are ultimately to comprise part of a memory array, and in the described aspect of the invention will ultimately comprise part of a DRAM array. For purposes of the discussion that follows, portion 12 can be referred to as a first portion (or region) of the semiconductor wafer 10, and portion 14 can be referred to as a second portion (or region) of the wafer.

Portions 12 and 14 comprise a substrate 16. Substrate 16 can comprise, for example, a monocrystalline silicon wafer lightly doped with a background p-type dopant and/or an n-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 16 further comprises a damage region 18 formed therein, and represented by a dashed line. Damage region 18 can be formed by implanting one or more isotopes of hydrogen into substrate 16; and can be formed before or after forming other shown structures associated with substrate 16. Damage region 18 will ultimately be utilized for making a so-called "smart cut" within substrate 16. Damage region 18 can be formed within substrate 16 by, for example, a one-time dose with deuterium to form the deuterium to an implant depth of from about 3,000 angstroms to about 10,000 angstroms deep within substrate 16. The deuterium dose can be from about $3 \times 10^{16}$ atoms/cm$^3$ to about $7 \times 10^{16}$ atoms/cm$^3$.

Diffusion regions 20 and 22 are formed within portion 12, and diffusion regions 24 and 26 are formed within portion 14. Diffusion regions 20, 22, 24 and 26 can comprise n-type diffusion regions or p-type diffusion regions.

An insulative material 28 extends across an upper surface of substrate 16. Insulative material 28 can comprise, for example, silicon dioxide. Another insulative material 30 is also formed across the upper surface of substrate 16. Insulative material 30 can comprise the same material as insulative material 28, or can comprise a different material. In particular embodiments, both insulative material 28 and insulative material 30 will comprise silicon dioxide. Conductive projections 32 and 34 are formed within portion 12, and conductive projections 36 and 38 are formed within portion 14. Projections 32, 34, 36 and 38 can comprise, for example, conductively-doped silicon, such as, for example, conductively-doped polycrystalline silicon. Projections 32, 34, 36, and 38 electrically connect with diffusion regions 20, 22, 24 and 26, respectively. Projections 32, 34, 36 and 38 will ultimately be incorporated as storage nodes of capacitor constructions.

A dielectric material 40 is formed across projections 32, 34, 36 and 38. Dielectric material 40 can comprise, for example, one or more of silicon dioxide and silicon nitride; and/or can comprise various high-K dielectric materials, such as, for example, tantalum pentoxide, hafnium oxide or aluminum oxide.

A conductive mass 42 is formed over dielectric material 40. Conductive mass 42 can comprise, for example, conductively-doped silicon. A second conductive mass 44 is formed over mass 42. Second conductive mass 44 can comprise, for example, a silicide, and can enhance electrical conduction across and within mass 42 in embodiments in which conductive mass 42 comprises doped silicon. It is to be understood that the invention encompasses other embodiments wherein second conductive mass 44 is omitted. Conductive mass 42 is ultimately incorporated as a cell plate in capacitor constructions, and dielectric material 40 is ultimately incorporated into the capacitor constructions to separate the cell plate from the storage nodes 32, 34, 36 and 38.

A bonding region 46 is shown formed over second conductive mass 44. Bonding region 46 typically comprises an oxide, such as, for example, silicon dioxide. Bonding region 46 can, however, comprise any material suitable for low temperature bonding (i.e., bonding at a temperature below 550° C. Low temperature bonding is desired in order to avoid diffusion of dopant beyond desired implant regions.

A silicon substrate 48 is shown bonded to bonding region 46. Substrate 48 provides a "handle" for manipulating wafer 10 during subsequent processing. The bonding of substrate 48 to region 46 can be accomplished by providing a first portion of oxide 46 associated with substrate 48 and a second portion of oxide 46 associated with silicide 44, and subsequently bonding the two oxide portions with one another by heating the oxide portions to a temperature of about 550° C. for a time of about 30 minutes.

Figure 2:
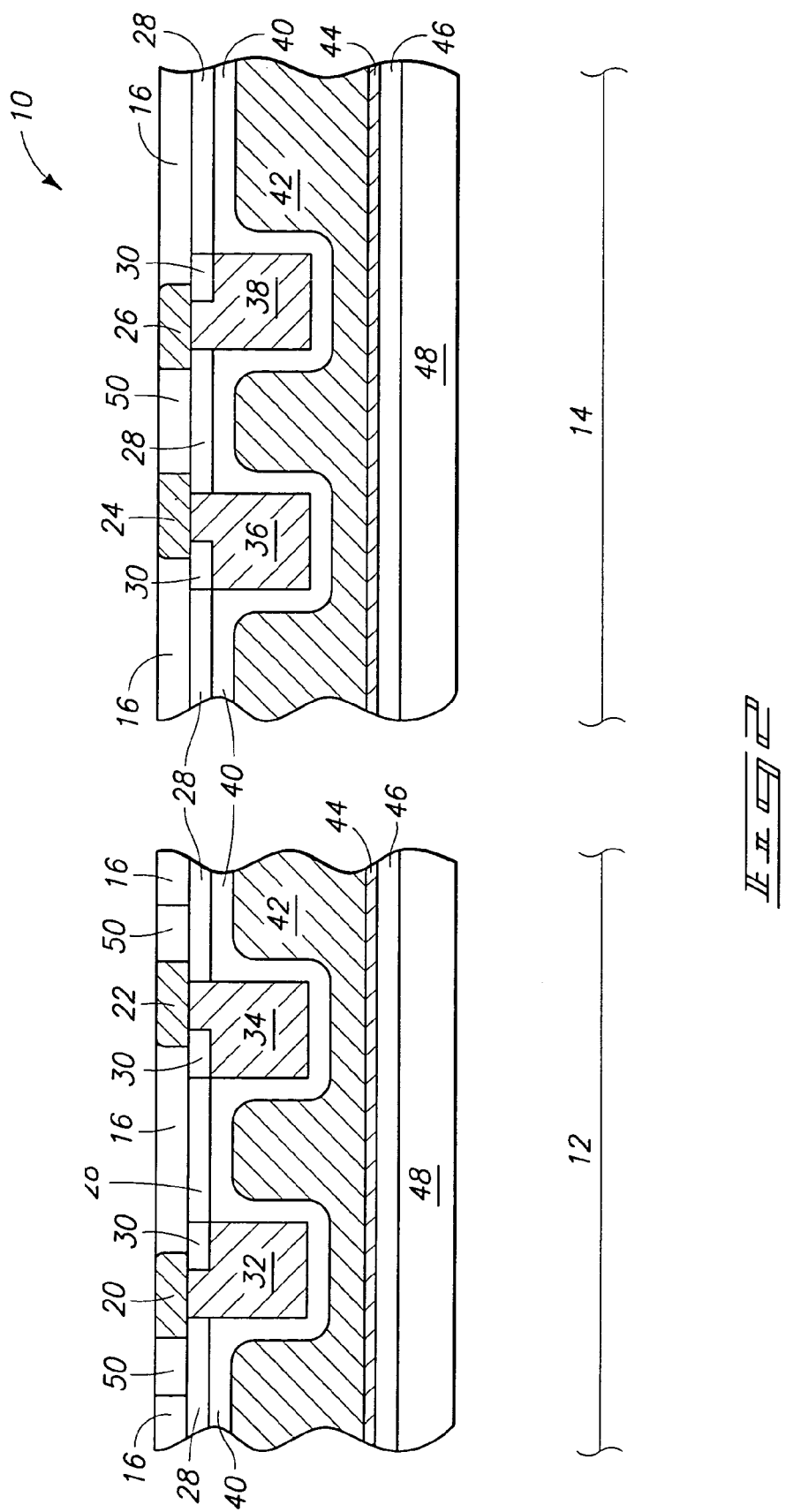
FIG. 2 is a view of the FIG. 1 portions shown at a processing step subsequent to that of FIG. 1.

Referring to FIG. 2, wafer 10 is shown in an inverted orientation relative to FIG. 1. The orientation of wafer 10 is inverted so that subsequent devices can be formed on substrate 16. Substrate 16 has been cleaved along defect region 18 (FIG. 1). Such cleavage can occur utilizing, for example, thermal processing and/or ultraviolet light. After the cleavage, substrate 16 is planarized to bring an illustrated upper surface of FIG. 2 down to a level of diffusion regions 20 and 22. Subsequently, trenches are formed within substrate 16 and filled with insulative material to define isolation regions 50 adjacent the diffusion regions 20 and 22, as well as to form an isolation region 50 between the diffusion regions 24 and 26. A suitable insulative material for isolation regions 50 is silicon dioxide.

Figure 3:
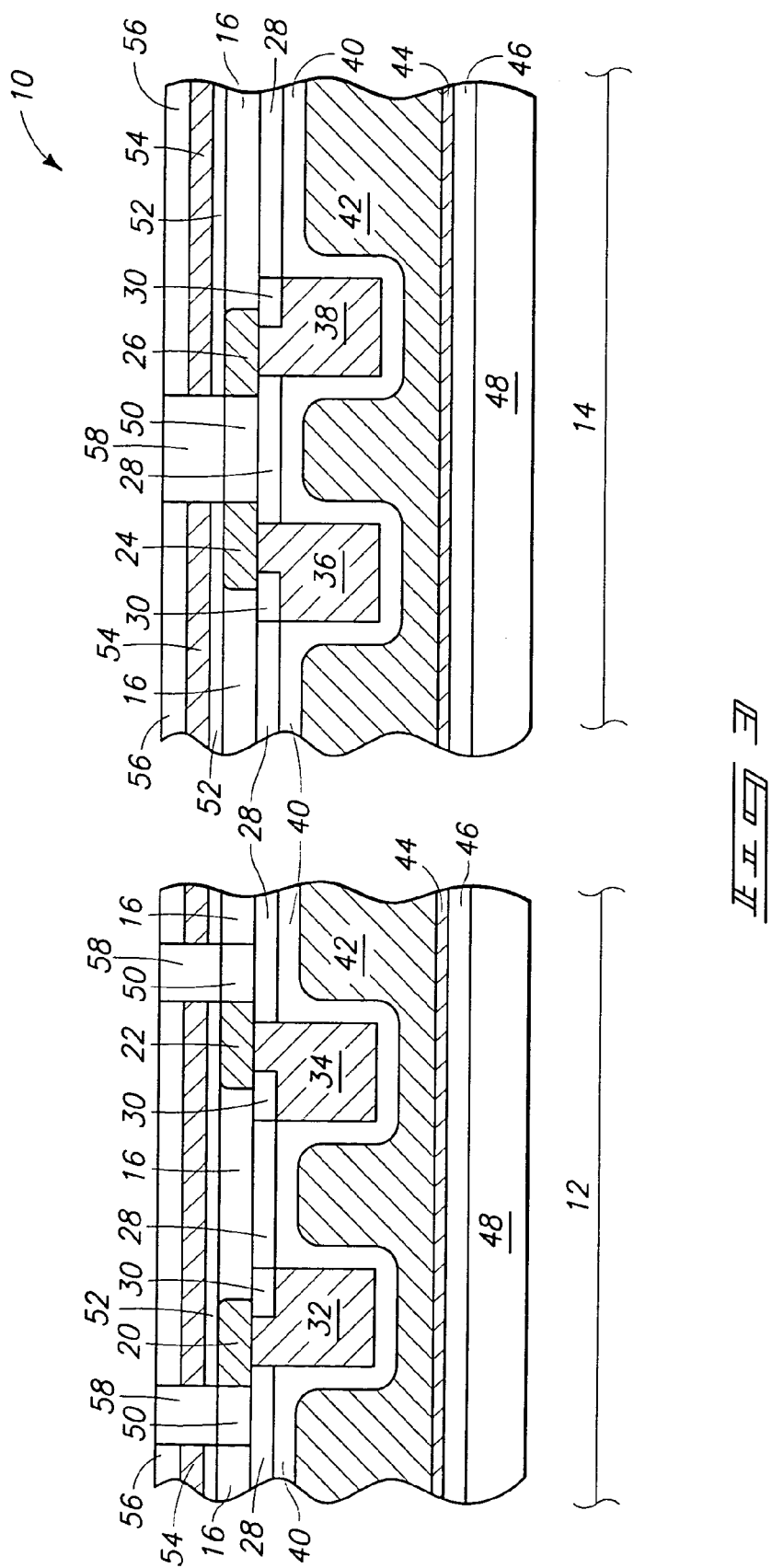
FIG. 3 is a view of the FIG. 1 portions shown at a processing step subsequent to that of FIG. 2.

Referring to FIG. 3, layers 52, 54 and 56 are formed over substrate 16, and in the shown embodiment form stacks over active areas of the cell. Layers 52, 54 and 56 can comprise, for example, silicon dioxide, conductively-doped silicon, and silicon nitride, respectively. Layer 54 can comprise metal silicide and/or elemental metal in addition to, or alternatively to, conductively-doped silicon. Layers 52 and 56 can be referred to as insulative material layers, and layer 54 can be referred to as a conductive material layer. In an exemplary embodiment, layer 52 comprises silicon dioxide or high-k dielectric material, and has an appropriate thickness to produce an electrically equivalent thickness relative to SiO$_2$ of about 15 Å. Layer 54 comprises conductively-doped polycrystalline silicon, and has a thickness of about 300 angstroms. Also, layer 56 comprises silicon nitride, and has a thickness of about 200 angstroms.

A pair of openings are formed through layers 52, 54 and 56 relative to portion 12, and such openings are filled with insulative material 58. Material 58 can comprise, for example, silicon dioxide. Also, a opening is formed relative to portion 14 and filled with insulative material 58. A misalignment-allowing patterning can be included, if desired.

Referring to FIG. 4, layer 56 is etched from over first portions 60 of region 12, while leaving some of layer 56 over a second portion 62 of region 12. The layer 56 remains over region 14 during the removal of portions of layer 56 relative to region 12. In embodiments in which layer 56 comprises silicon nitride, a suitable etch can be accomplished utilizing CF$_4$ and O$_2$. Prior to the etch, photolithographic processing can be utilized to form a patterned photoresist (not shown) which ultimately is utilized for patterning layer 56 into the shown configuration.

Referring to FIG. 5, a conductive material 64 is formed over regions 12 and 14. Conductive material 64 can comprise, for example, conductively-doped silicon, such as conductively-doped polycrystalline silicon. Conductive material 64 can alternatively, or additionally, comprise W and/or WN. Conductive material 64 can alternatively, or additionally, comprise metal silicide or elemental metal. Conductive material 64 can be formed to a thickness of, for example, from about 200 Å to about 500 Å.

Conductive material 64 contacts conductive layer 54 at regions 60, but is separated from material 54 at the region 62 of portion 12. In the shown embodiment, conductive material 64 physically and electrically contacts conductive material 54 at the region 60 of portion 12.

Conductive material 64 is separated from conductive material 54 across an entirety of portion 14. Specifically, insulative material 56 within portion 14 physically and electrically separates conductive material 64 from conductive material 54.

An insulative material 66 is formed over conductive material 64. Insulative material 66 can comprise, for example, silicon dioxide, and can be formed to a thickness of, for example, from about 100 Å to about 300 Å.

A patterned photoresist layer 68 is formed over portions 12 and 14, and specifically is formed over insulative material 66. Photoresist layer 68 can be patterned by, for example, photolithographic processing. The patterned photoresist 68 has openings 70, 72, 74, 76, 78 and 80 extending therethrough.

Referring to FIG. 6, openings 70, 72, 74, 76, 78 and 80 are extended through materials 66 and 64, to terminate at insulative materials 56 and 58.

Figure 7:
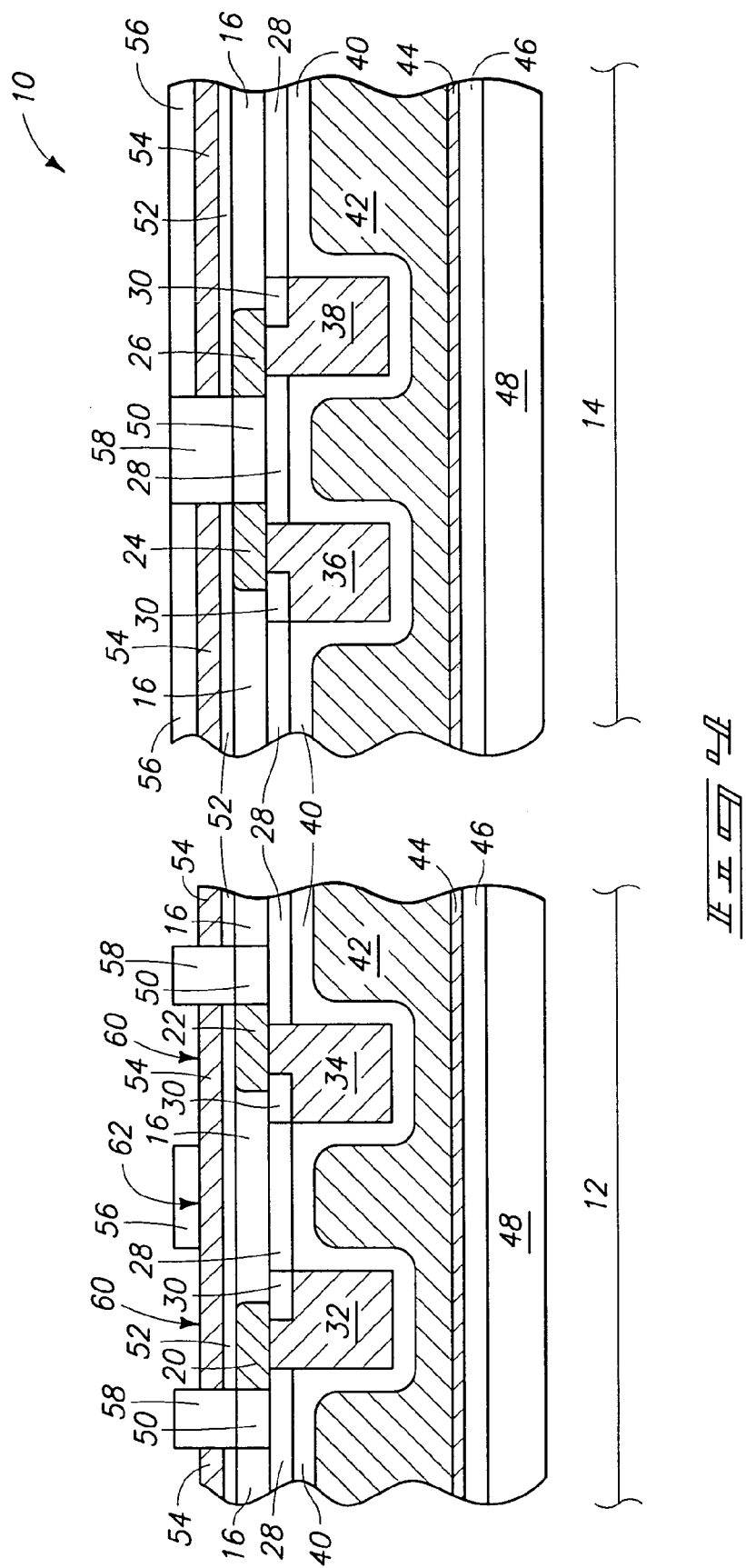
FIG. 7 is a view of the FIG. 1 portions shown at a processing step subsequent to that of FIG. 6.

Referring to FIG. 7, openings 72, 76 and 80 are extended to substrate 16 (or at least to proximate substrate 16), while openings 70, 74 and 78 are not significantly extended. In a preferred embodiment in which material 56 comprises silicon nitride, material 54 comprises, or consists essentially of conductively-doped silicon, and blocks 58 comprise silicon dioxide; a suitable etch is an etch selective for silicon nitride and conductively-doped silicon relative to silicon dioxide.

It is noted that the shown etch has penetrated through the thin silicon dioxide layer 52. Such can be accomplished by utilizing an etch which is not entirely selective for silicon dioxide material relative to silicon nitride and conductively-doped silicon. The etch will then remove some of conductive blocks 58, and will penetrate silicon dioxide layer 52. However, it is to be understood that the invention encompasses other embodiments (not shown) wherein the etch only penetrates through silicon nitride layer 56 and conductively-doped silicon layer 54, and does not penetrate through silicon dioxide layer 52.

After openings 72, 76 and 80 are extended, a dopant is implanted into the openings to form conductively-doped diffusion regions 84, 86 and 88. Diffusion regions 84, 86 and 88 are shallower than adjacent diffusion regions, and can be ultra-shallow. Diffusion regions 84, 86 and 88 can comprise, for example, n-type doped regions. The diffusion regions are illustrated extending only partially into substrate 16, but it is to be understood that the invention encompasses other embodiments (not shown) wherein the diffusion regions are extended entirely across (through) substrate 16.

Referring to FIG. 8, photoresist 68 (FIG. 7) is removed, and subsequently an insulative mass 90 is formed over portions 12 and 14. Mass 90 fills openings 72, 76 and 80 (FIG. 7), as well as openings 70, 74 and 78 (FIG. 7). Mass 90 is planarized utilizing, for example, chemical-mechanical polishing. Mass 90 can comprise, for example, silicon dioxide. After mass 90 is planarized, a photoresist mask 92 is formed over portions 12 and 14. Mask 92 is patterned over portion 14 utilizing, for example, photolithographic techniques. The patterned mask 92 over portion 14 has openings 94, 96 and 98 extending therethrough.

Figure 9:
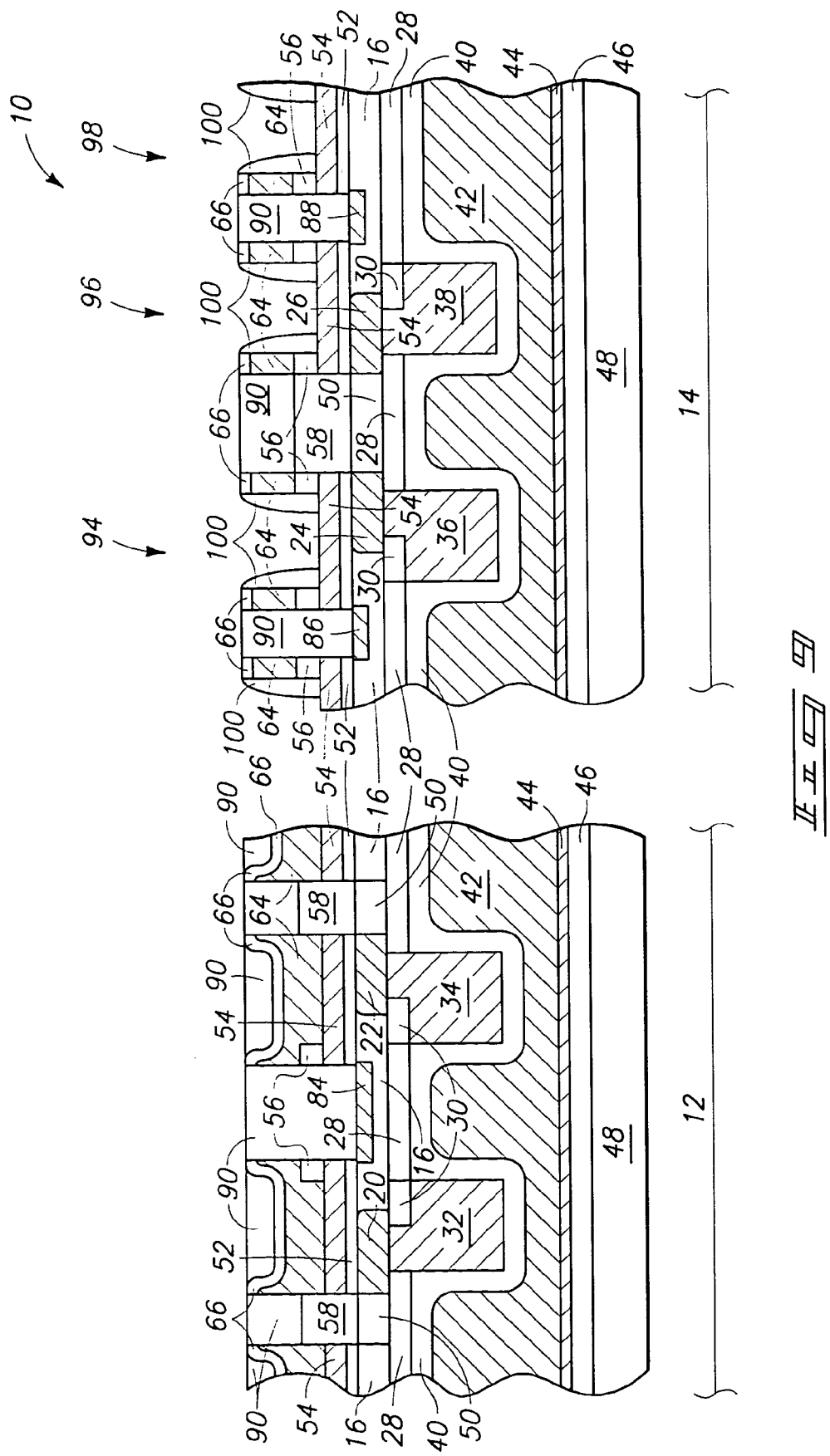
FIG. 9 is a view of the FIG. 1 portions shown at a processing step subsequent to that of FIG. 8.

Referring to FIG. 9, openings 94, 96 and 98 are extended through layers 56, 64 and 66 to expose a surface of conductive layer 54. Photoresist 92 (FIG. 8) is subsequently removed, and spacers 100 are formed within openings 94, 96 and 98 to narrow the openings. Spacers 100 cover edges of conductive material 64 that would otherwise be exposed within the openings. Spacers 100 can be formed by, for example, depositing a suitable insulative material (such as, for example, silicon dioxide or silicon nitride), and subsequently exposing the insulative material to an anisotropic etch to pattern the material into the shown spacers.

Figure 10:
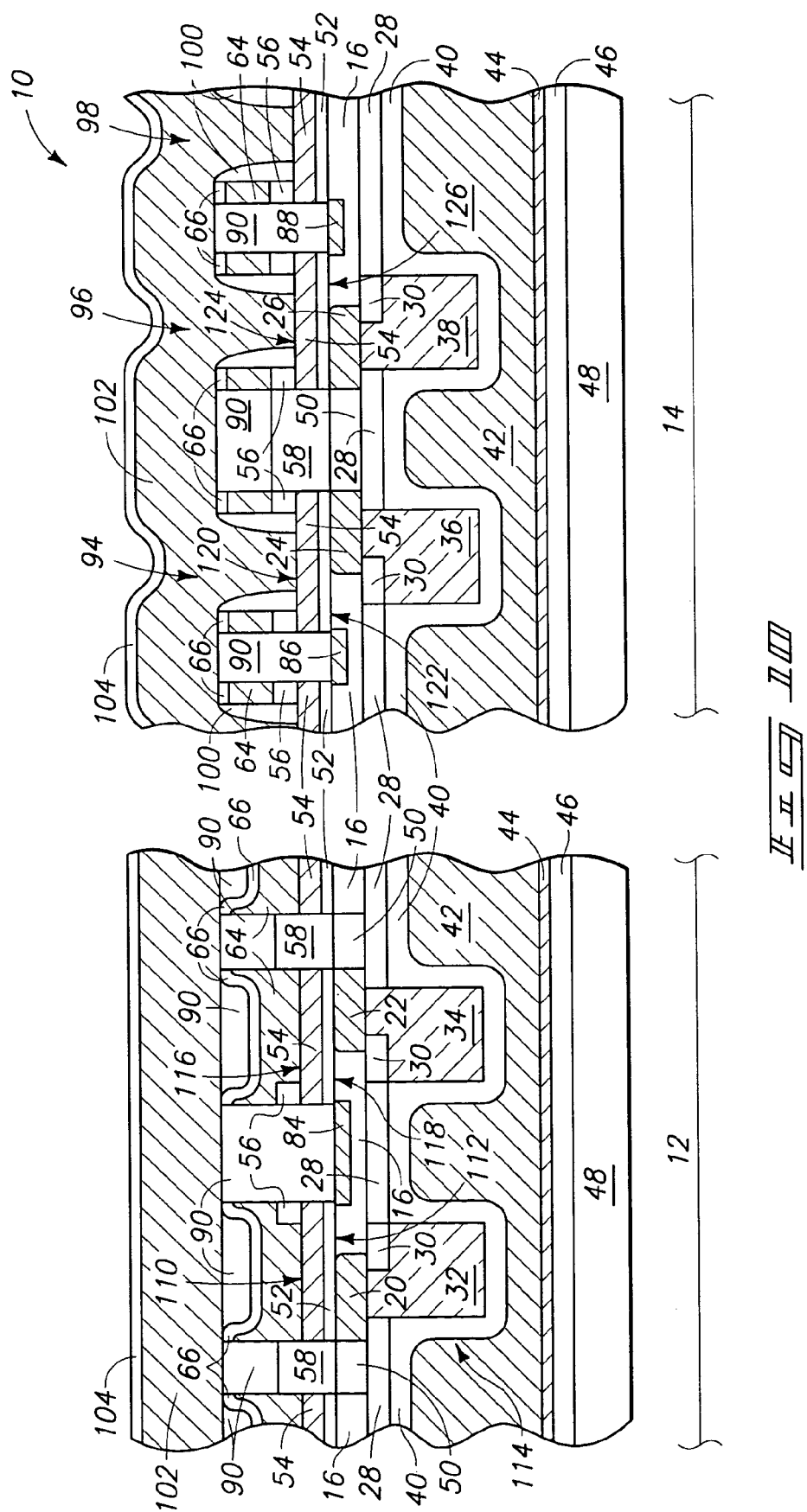
FIG. 10 is a view of the FIG. 1 portions shown at a processing step subsequent to that of FIG. 9.

Referring to FIG. 10, a conductive material 102 and an insulative material 104 are formed over portions 12 and 14. Electrically conductive material 102 can comprise, for example, conductively-doped polysilicon and electrically insulative material 104 can comprise, for example, silicon dioxide or silicon nitride. Conductive material 102 extends within openings 94, 96 and 98 to form electrical interconnects which electrically contact conductive material 54. Conductive material 102 can be considered to define a conductive line extending across portion 14 and electrically connected to conductive material 54 through interconnects that extend within openings 94, 96 and 98. In the shown embodiment, the interconnects are formed simultaneously with the formation of the conductive line 102 and comprise the same material as conductive line 102. However, it is to be understood that the invention encompasses other embodiments (not shown) wherein the conductive interconnects are formed within openings 94, 96 and 98 prior to formation of conductive line 102, and wherein the conductive interconnects comprise a different material than conductive line 102.

Portions 12 and 14 comprise transistor/capacitor pairs that can be considered elements of DRAM cells. For instance, portion 12 comprises a region of conductive material 54 extending between conductively-doped regions 20 and 84 that can be considered as a first transistor gate 110. Specifically, conductive material 54 can gatedly connect conductively-doped regions 20 and 84 through a channel region 112 defined beneath conductive layer 54 and within semiconductive material substrate 16. Such channel region can be appropriately doped prior to formation of oxide layer 52 at, for example, the processing step shown in FIG. 2. Conductive material 32 can be considered to comprise a storage node of a capacitor construction 114, and transistor 110 can be considered to electrically and gatedly connect capacitor construction 32 with conductively-doped region 84.

A second transistor gate 116 is defined by a region of conductive material 54 extending between diffusion regions 22 and 84, and such comprises a channel region 118 thereebeneath. Transistor gate 116 electrically and gatedly connects capacitor 34 with a node location defined by diffusion region 84.

Referring to portion 14, such comprises a transistor gate defined by a region of conductive material 54 extending between diffusion regions 24 and 86, and which is labeled as transistor gate 120. Transistor gate 120 comprises a channel region 122 therebeneath. Also, a transistor gate 124 is defined by a region of conductive material 54 extending between diffusion regions 26 and 88, and such has a channel region 126 extending thereunder. Transistor gate 120 gatedly connects a capacitor comprising storage node 36 with a node location defined by conductively-doped region 86; and transistor 124 gatedly connects a capacitor comprising storage node 38 with a node location defined by diffusion region 88.

In particular aspects of the invention, conductive layer 64 can be considered a first conductive line, and conductive layer 102 can be considered a second conductive line. Conductive line 64 electrically connects with transistor gates defined by material 54 over region 12, but does not electrically connect with conductive material 54 over region 14. Instead, line 64 is separated from conductive material 54 over an entirety of region 14 by insulative material 56. In contrast, the conductive line defined by material 102 electrically connects with conductive material 54 and any transistor gates defined thereby over region 14, but does not electrically connect with material 54 over region 12. Instead, the conductive line defined by material 102 is separated from conductive material 54 over region 12 by at least the insulative materials 66 and 90.

Ultimately, electrical connections can be formed through materials 104, 102 and 90 to diffusion regions 84, 86 and 88 to allow bitline connections to such diffusion regions. Accordingly, DRAM arrays can be defined wherein conductive material 54 defines a wordline having transistor gates comprised thereby, and bitline interconnections are formed to node locations 84, 86 and 88. FIGS. 11–15 illustrate an exemplary method of forming bitline interconnections to node locations 84, 86 and 88.

Figure 11:
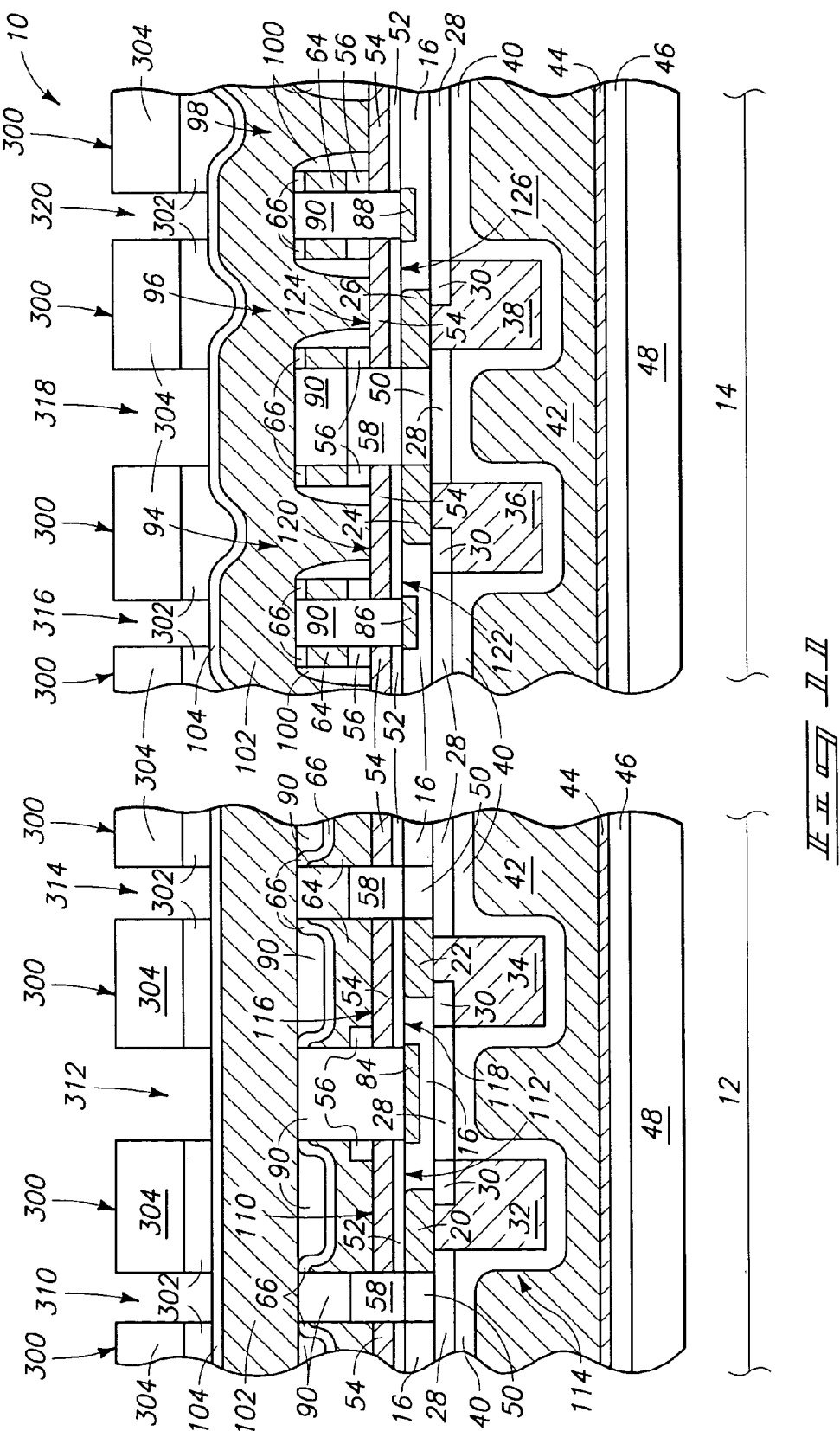
FIG. 11 is a view of the FIG. 1 portions shown at a processing step subsequent to that of FIG. 10.

Referring to FIG. 11, a patterned mask 300 is formed over regions 12 and 14. In the shown embodiment, mask 300 includes a first component 302 comprising silicon and nitrogen (with an exemplary composition of the first component being silicon nitride), and a second component 304 comprising photoresist. Openings 310, 312, 314, 316, 318 and 320 are defined by patterned mask 300.

Figure 12:
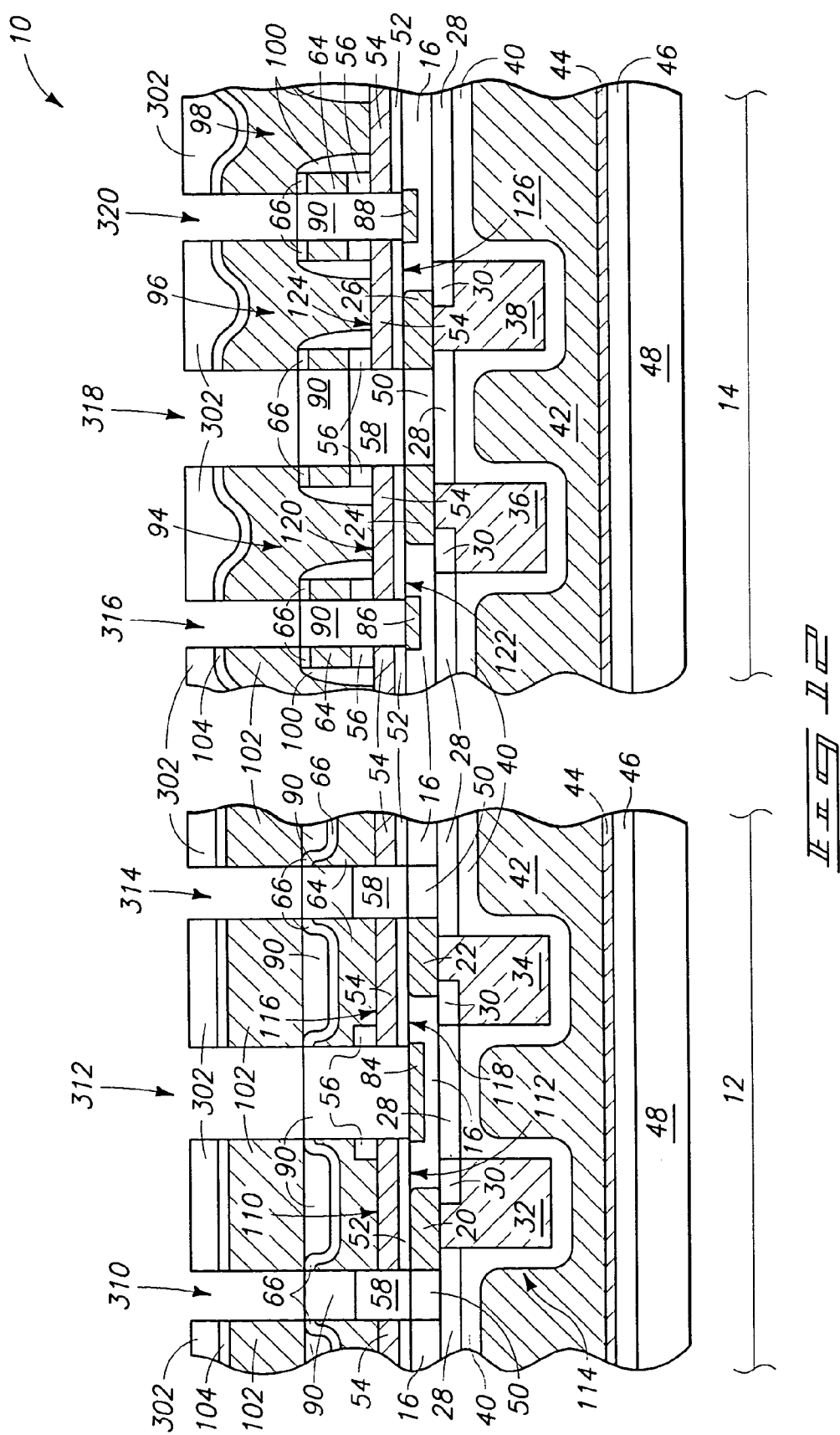
FIG. 12 is a view of the FIG. 1 portions shown at a processing step subsequent to that of FIG. 11.

Referring to FIG. 12 openings 310, 312, 314, 316, 318 and 320 are extended through layers 102 and 104. Also, photoresist component 304 (FIG. 11) of mask 300 (FIG. 11) is removed. The openings 310, 312, 314, 316, 318 and 320 are preferably aligned with blocks of material 90, but it is to be understood that some misalignment can occur.

Figure 13:
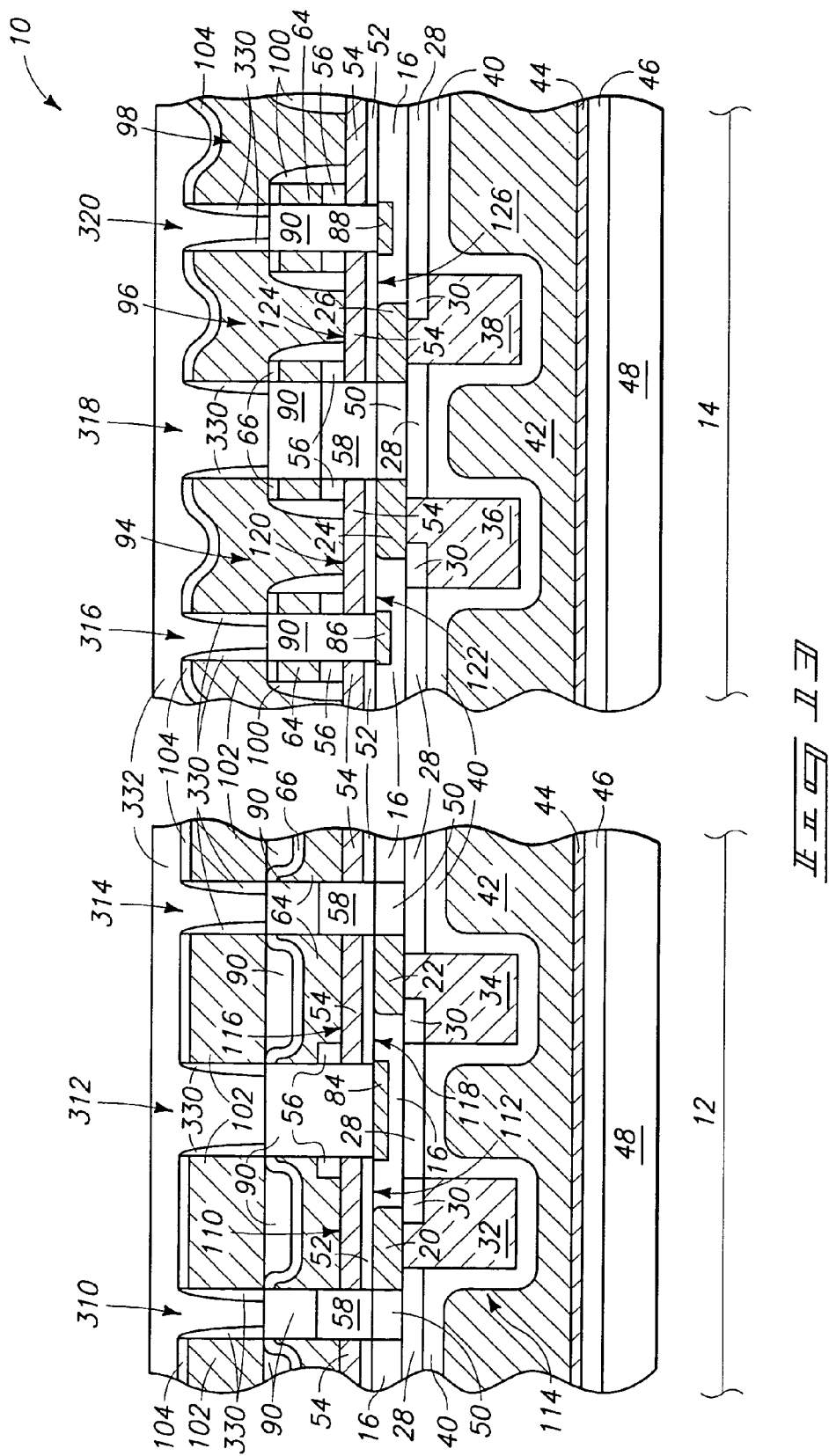
FIG. 13 is a view of the FIG. 1 portions shown at a processing step subsequent to that of FIG. 12.

Referring to FIG. 13, spacers 330 are formed within openings 310, 312, 314, 316, 318 and 320; and component 302 (FIG. 12) of mask 300 (FIG. 11) is removed. Spacers 330 comprise electrically insulative material, and can comprise, for example, silicon dioxide or silicon nitride. After formation of spacers 330 and removal of component 302, an electrically insulative material 332 is formed over regions 12 and 14 and within openings 310, 312, 314, 316, 318 and 320. Material 332 can comprise, for example, silicon dioxide.

Figure 14:
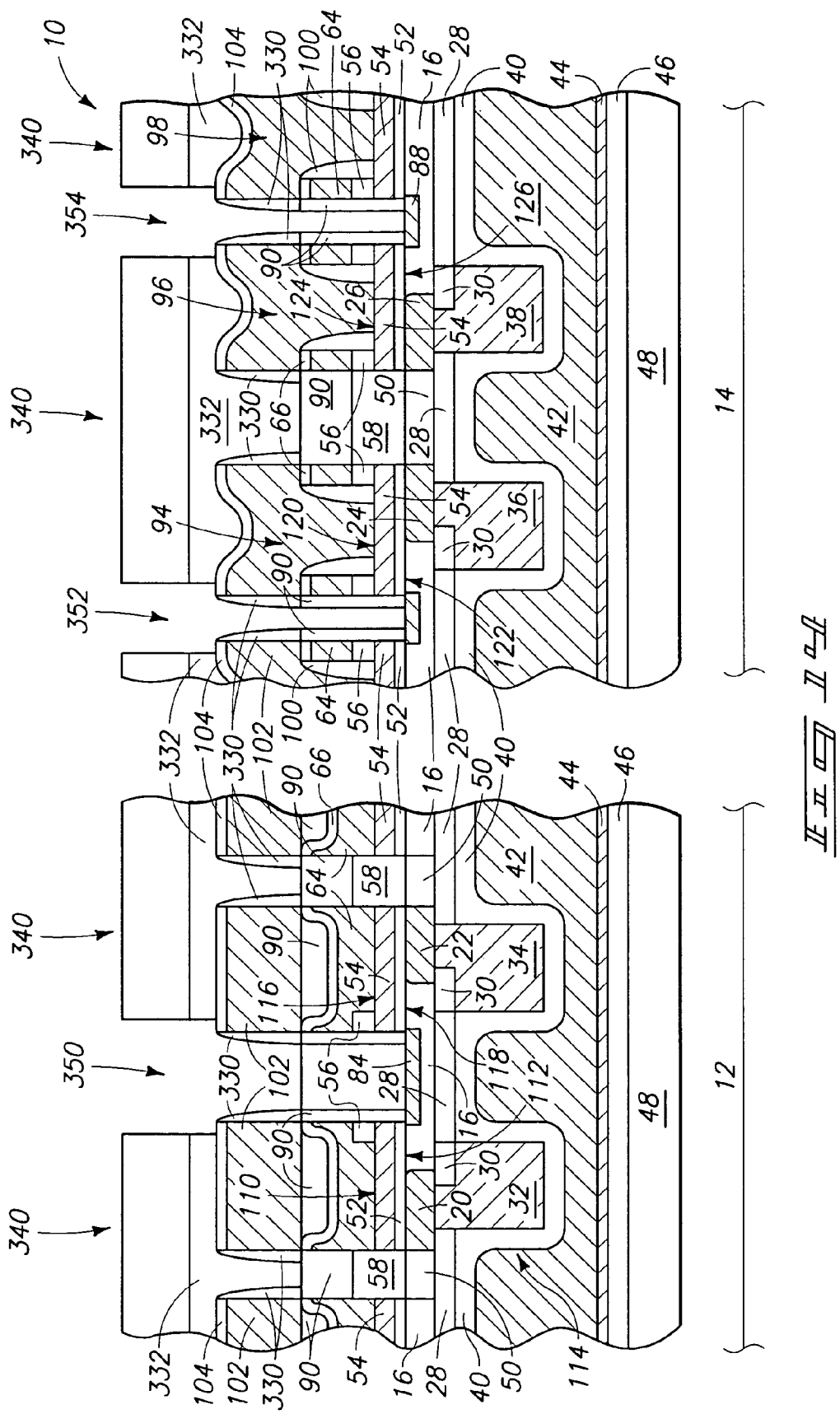
FIG. 14 is a view of the FIG. 1 portions shown at a processing step subsequent to that of FIG. 13.

Referring to FIG. 14, a patterned mask 340 is formed over material 332. Mask 340 can comprise, for example, photoresist. Mask 340 defines openings 350, 352 and 354; and such openings are extended substantially to diffusion regions 84, 86 and 88, respectively. The openings to the source/drain regions are described above as being formed "substantially" to the source/drain regions to indicate that the opening extends close enough to the source/drain regions to enable a conductive electrical connection to extend from the source/drain regions to a conductive material formed within the openings. Such can be accomplished by extending the openings entirely to the doped source/drain regions, or by extending the openings to only near the source/drain regions.

Figure 15:
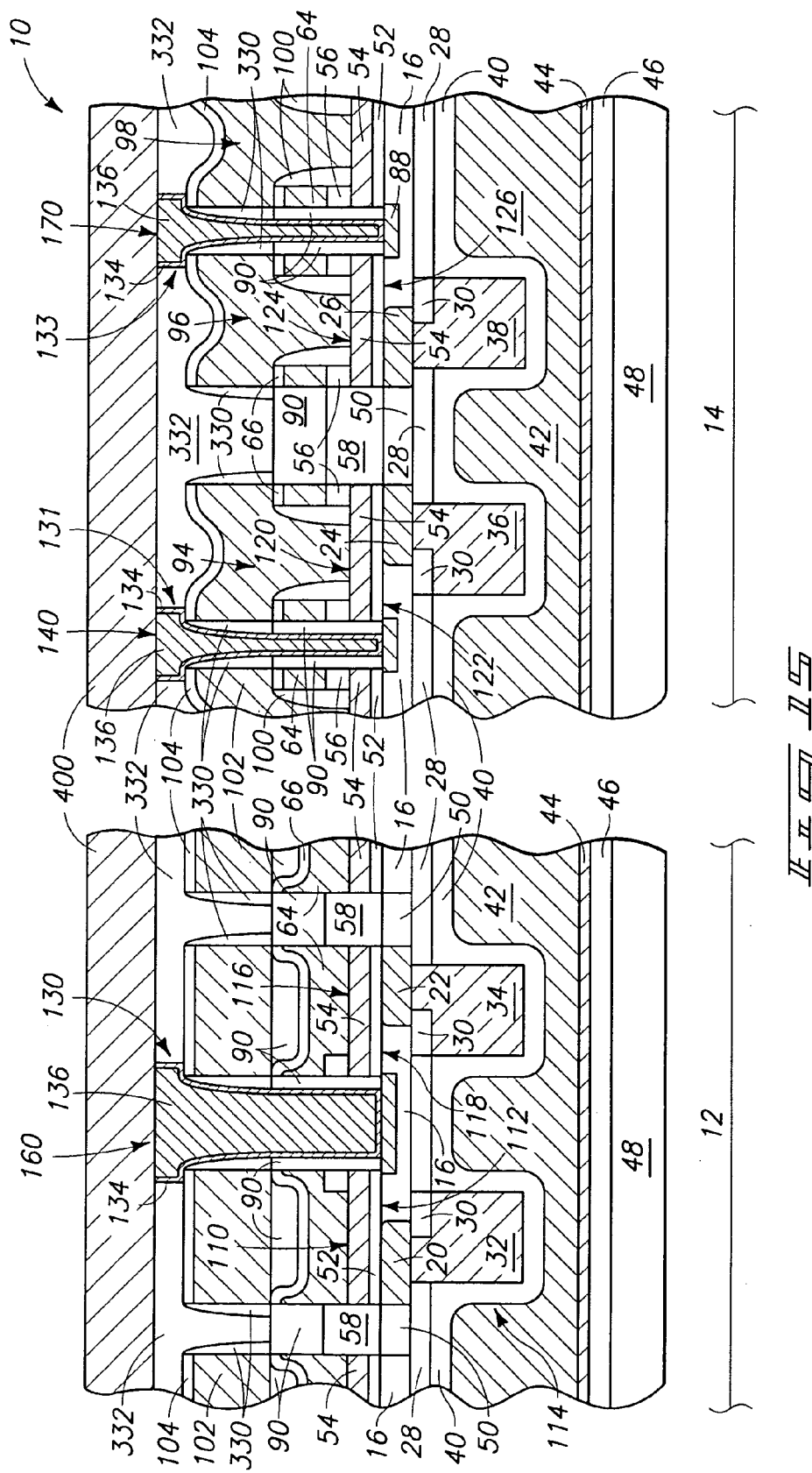
FIG. 15 is a view of the FIG. 1 portions shown at a processing step subsequent to that of FIG. 14.

Referring to FIG. 15, mask 340 (FIG. 14) is removed; and bitline interconnections 130, 131 and 133 are formed in openings 350, 352 and 350 (FIG. 14), respectively. The interconnections include suitable conductive materials to establish conductive interconnects. In the shown embodiment, two conductive materials are utilized for the interconnections. The first of the conductive materials is labeled as 134, and the second conductive material is labeled as 136. Material 134 can comprise, for example, titanium nitride or tungsten nitride; and material 136 can comprise, for example, one or both of elemental titanium and elemental tungsten. A silicide layer (not shown) can be formed at interfaces of the diffusion regions and conductive material 134.

A bitline (or digitline) 400 is shown formed over regions 12 and 14. Bitline 400 can be a continuous bitline extending over both of regions 12 and 14, or can comprise a separate bitline over region 12 relative to that over region 14. The conductive interconnects 130, 131 and 133 are shown making bitline interconnections 140, 160 and 170, respectively.

Figure 16:
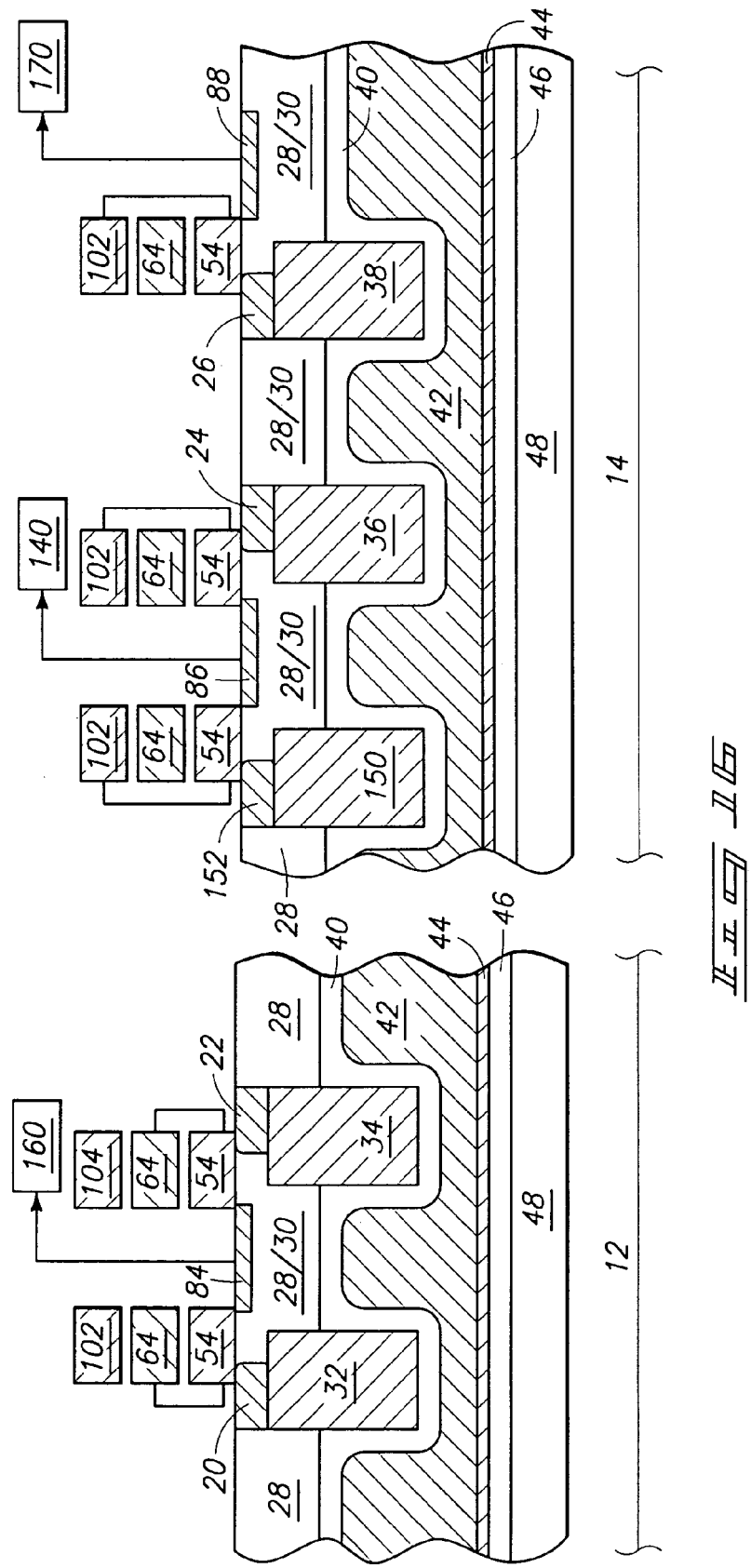
FIG. 16 is an alternate view of the portions of FIG. 15, diagrammatically illustrating electrical connections associated with illustrated electrically devices.

A simplified diagrammatic view of regions 12 and 14 is provided in FIG. 16 to illustrate various aspects of the present invention. FIG. 16 illustrates portion 14 expanded to encompass a third storage node 150, and an additional diffusion region 152.

The simplified diagram of FIG. 16 shows that conductive layer 54 forms transistor gates over portions 12 and 14. The diagram of FIG. 16 further shows that the transistor gates over portion 12 are electrically connected with a conductive line comprising layer 64, while the transistor gates over portion 14 are electrically connected with a conductive line comprising material 102. In a sense, conductive material 54 can be considered to define wordlines which spread over storage node junctions, and which are wider than an actual access gate length. Actually, conductive material 54 comprises portions of the wordlines, and the remaining conductive portions of the wordlines are defined by conductive materials 64 and 102. Materials 64 and 102 effectively piggyback over one another, but define two distinct wordlines which can be utilized for addressing the circuitry over regions 12 and 14. The use of two wordlines can allow unique memory addressing of the transistors associated with region 12 versus those associated with region 14.

It is noted that regions 12 and 14 can alternate with respect to one another across a DRAM array, and further that the wordline connection shown with respect to region 14, although different in symmetry than the wordline connections shown with respect to region 12, can have a very similar resistance to those of region 12. Such may be due to the top conductive material 102 having about a common influence over regions 12 and 14, even though it does not directly connect with conductive material 54 over region 12. Processing of the present invention can be relatively simple, and can utilize less masks than prior art approaches for forming DRAM cells. Although the diagram of FIG. 12 shows the stack of layers 54, 64 and 102 over node 150 to have an electrical connection between layers 54 and 102, it is to be understood that the stack could alternatively have the electrical connection between layers 54 and 64 (i.e., could have the construction of the stacks associated with fragment 12, rather than the construction of the other stacks associated with fragment 14).

Figure 17:
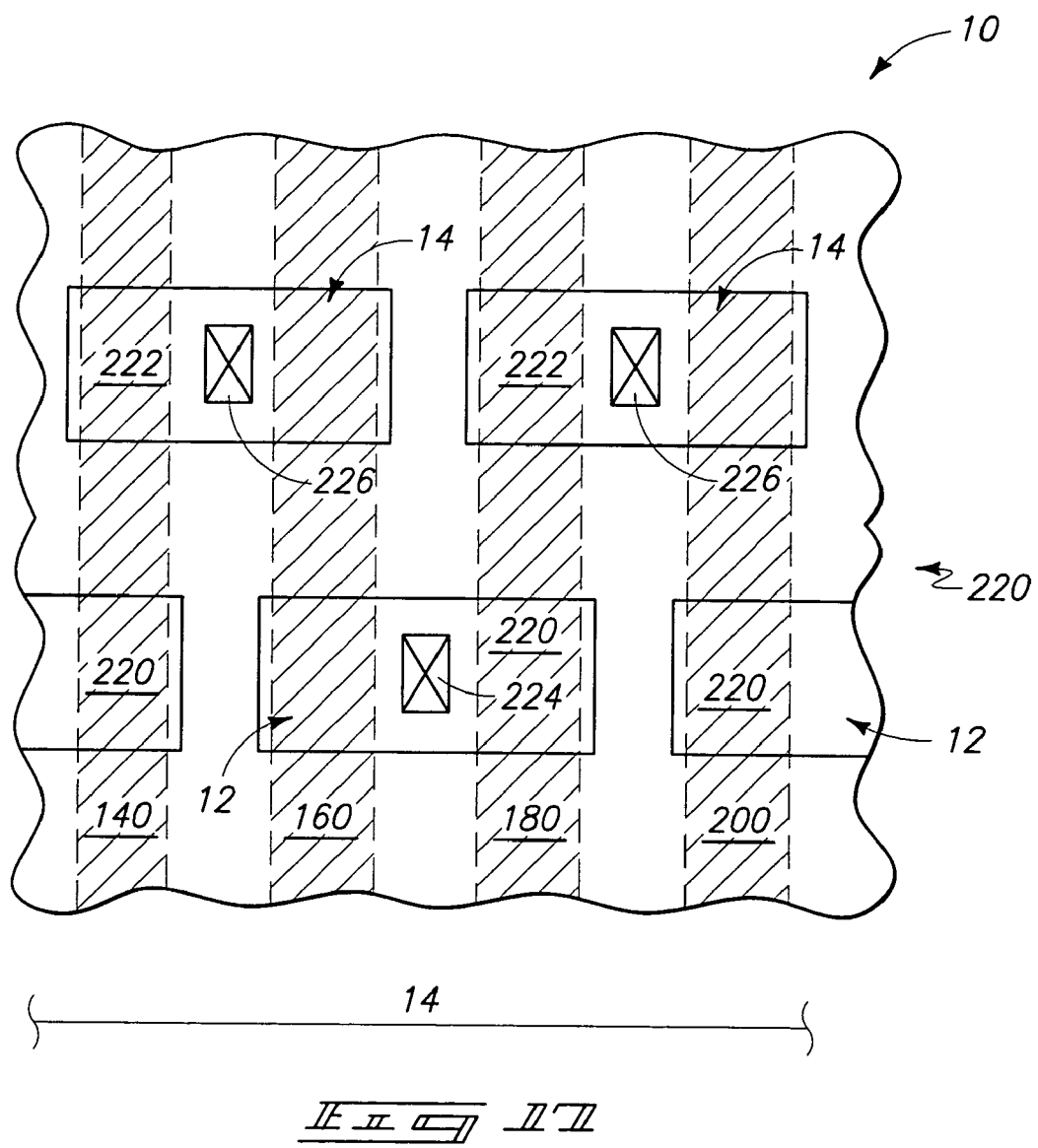
FIG. 17 is a diagrammatic, schematic, top view of a semiconductor wafer fragment illustrating a relative orientation of conductive lines formed in accordance with methodology of the present invention.

FIG. 17 is a top view of wafer fragment 10 illustrating exemplary architecture which can be utilized with the methodology of the present invention. A series of bitlines 140, 160, 180 and 200 are illustrated extending longitudinally across the page, and wordlines 220 and 222 are illustrated extending laterally across the page. Wordlines 220 and 222 have interconnections 224 and 226, respectively, which extend out of the page. The interconnections can be connected to some conductive straps (not shown) which electrically interconnect the shown isolated portions of regions 222 with one another, and to other conductive straps (not shown) which electrically interconnect the shown isolated regions of portions 220 with one another.

Wordline region 220 comprises the connections shown previously for regions 12 (i.e. bottom connections), and wordline region 222 comprises the connections described previously with reference to portion 14 (i.e. the top connections). The architecture of FIG. 13 can be a true $6F^2$ architecture. Specifically, a distance across a bitline (for example, bitline 160) can be 2F to define a width of a cell, and a length of the cell can be 3F. Accordingly, the area of the cell can be $6F^2$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An array of memory cells comprising:
    a set of capacitor constructions, the set of capacitor constructions being defined to include a first subset of capacitor constructions and a second subset of capacitor constructions;
    a first wordline over the set of capacitor constructions, the first wordline being in electrical connection with the first subset of capacitor constructions;
    a second wordline over the first wordline and in electrical connection with the second subset of capacitor constructions; and
    wherein the first wordline does not electrically connect with the second subset of capacitor constructions and the second wordline does not electrically connect with the first subset of capacitor constructions.

2. The array of claim 1 wherein the second wordline is over the set of capacitor constructions.

3. The array of claim 2 further comprising:
    openings extending through the first wordline and proximate the second subset of capacitor constructions;
    sidewall spacers within the openings and narrowing the openings; and
    conductive material within the openings, the conductive material electrically connecting the second wordline to the second subset of capacitor constructions.

4. The array of claim 3 wherein the conductive material comprises conductively-doped silicon.

5. The array of claim 2 wherein the first and second wordlines comprise conductively-doped silicon.

6. The array of claim 2 further comprising an insulative material layer over the second subset of capacitor constructions; the insulative material layer physically and electrically separating the second subset of capacitor constructions from the first wordline.

7. The array of claim 6 wherein the insulative material layer comprises silicon nitride.

8. The array of claim 2 further comprising:
    a semiconductive material over the set of capacitor constructions;
    source/drain regions within the semiconductive material, the source/drain regions being proximate at least some of the first and second wordlines;
    openings extending through the first and second wordlines and to the source/drain regions; and
    bitline interconnections within the openings and electrically connected through the source/drain regions to the set of capacitor constructions.

\* \* \* \* \*

UNITED STATES PATENT AND TRADEMARK OFFICE
CERTIFICATE OF CORRECTION

PATENT NO. : 7,005,692 B2  Page 1 of 1
APPLICATION NO. : 10/632272
DATED : February 28, 2006
INVENTOR(S) : Gonzalez It is certified that error appears in the above-identified patent and that said Letters Patent is hereby corrected as shown below:

Title page, Item (56) References Cited, U.S. PATENT DOCUMENTS, please insert --6,423,596   06/2002   McKee-- after "Takenaka"

Col. 2, line 40, please delete "electrically" after "illustrated" and insert --electrical--.

Col. 3, line 66, please delete "550° C" after "below" and insert --550° C)--.

Col. 7, line 54, please delete "350" after "and" and insert --354--.

Signed and Sealed this

Seventeenth Day of April, 2007

JON W. DUDAS
*Director of the United States Patent and Trademark Office*